(12) United States Patent
Ochi

(10) Patent No.: US 6,507,239 B2
(45) Date of Patent: Jan. 14, 2003

(54) LOW NOISE AND LOW OFFSET BIPOLAR INPUT AMPLIFIERS

(75) Inventor: Sam S. Ochi, Saratoga, CA (US)

(73) Assignee: IXYS Corporation, Santa Clara, CA (US)

( * ) Notice: Subject to any disclaimer, the term of this patent is extended or adjusted under 35 U.S.C. 154(b) by 0 days.

(21) Appl. No.: 09/910,433

(22) Filed: Jul. 20, 2001

(65) Prior Publication Data

US 2002/0036933 A1 Mar. 28, 2002

Related U.S. Application Data

(60) Provisional application No. 60/220,234, filed on Jul. 21, 2000.

(51) Int. Cl.[7] .............................. G06G 7/12; G06G 7/26

(52) U.S. Cl. ....................... 327/560; 327/556; 330/253; 330/254

(58) Field of Search .................................. 327/560, 561, 327/562, 563, 359, 65, 89; 330/253, 254

(56) References Cited

U.S. PATENT DOCUMENTS

| | | | |
|---|---|---|---|
| 5,867,778 A | | 2/1999 | Khoury et al. ............... 455/333 |
| 6,084,472 A | * | 7/2000 | Gilbert ........................ 327/359 |
| 6,232,839 B1 | * | 5/2001 | Honda ......................... 330/254 |

* cited by examiner

*Primary Examiner*—Tuan T. Lam
(74) *Attorney, Agent, or Firm*—Townsend and Townsend and Crew LLP; Steven J. Cahill

(57) ABSTRACT

The present invention comprises an input amplifier circuit that provides a low input offset voltage amplified output signal. Input amplifiers of the present invention include a differential pair of transistors that may be fabricated using standard CMOS process steps. Each transistor in the differential pair includes a parasitic transistor that reduces the current through the associated differential pair transistor. The differential pair has a single ended output coupled to the input of a second amplifier such as a MOSFET. The current through the second amplifier determines the output signal $V_{OUT}$. The second amplifier is coupled to a third transistor which also includes a parasitic transistor. The third transistor provides a bias current to the second amplifier that is proportional to the current through the differential pair transistors.

25 Claims, 3 Drawing Sheets

US 6,507,239 B2

LOW NOISE AND LOW OFFSET BIPOLAR INPUT AMPLIFIERS

CROSS-REFERENCES TO RELATED APPLICATIONS

This application claims priority to U.S. Provisional Patent Application No. 60/220,234 to Ochi, filed Jul. 21, 2000, which is hereby incorporated by reference herein.

BACKGROUND OF THE INVENTION

The present invention relates to input amplifiers, and more particularly, to input amplifiers that have low noise and low offset output signals and are compatible with standard submicron CMOS processes.

An input amplifier is a type of amplifier that may be used as an input stage for circuit applications such as an operational amplifier or a comparator. FIG. 1 illustrates prior input amplifier 10 comprising transistors made from standard submicron CMOS processes. Input voltage $V_{IN}$ is applied to the bases of PNP bipolar junction transistors (BJTs) $Q_{L1}$ and $Q_{L2}$. BJTs $Q_{L1}$ and $Q_{L2}$ comprise a differential pair amplifier, with a bias current (equal to I) from current source I1 and a single ended output at the gate of n-channel MOSFET M3. The emitters of BJTs $Q_{L1}$ and $Q_{L2}$ are coupled to a current mirror circuit comprising n-channel MOSFETs M1 and M2. The drain of M2 is coupled to the gate of transistor M3. Transistor M3 is a common-source amplifier that provides voltage gain to the input signal to produce output voltage $V_{OUT}$ at the drain of M3. Transistor M3 is biased from current source I2, at a current equal to I.

FIGS. 3A–3B illustrates top down and cross sectional layout views, respectively, of PNP BJTs $Q_{L1}$ and $Q_{L2}$. BJTs $Q_{L1}$ and $Q_{L2}$ are each lateral PNP BJTs that may be fabricated using standard submicron CMOS process steps that are used to fabricate p-channel MOSFETs. Each of BJTs $Q_{L1}$ and $Q_{L2}$ includes a parasitic vertical PNP BJT, $Q_{S1}$ and $Q_{S2}$, respectively, as shown in FIGS. 1 and 3A–3B. The lateral PNP BJTs ($Q_{L1}$ and $Q_{L2}$) and their parasitic vertical PNP BJTs ($Q_{S1}$ and $Q_{S2}$) share the same base and emitter semiconductor regions, but have different collector semiconductor regions as shown in FIGS. 3A–3B. Lateral BJTs $Q_{L1}$ and $Q_{L2}$ each have a collector terminal coupled to a P+ collector region 32 that surrounds a P+ emitter region 31 as shown in FIGS. 3A–3B. Vertical BJTs $Q_{S1}$ and $Q_{S2}$ each have a collector terminal coupled to a P+ region 33 that is tied to the P-substrate region of the device, which is grounded. FIG. 3C illustrates a schematic of the lateral and vertical PNP BJTs of FIGS. 3A–3B.

Referring to FIG. 1, a current equal to I/2 flows through each of transistors $Q_{L1}$ and $Q_{L2}$ when $V_{IN}$ equals zero, assuming that no current flows into transistors $Q_{S1}$ and $Q_{S2}$. Transistor M3 is sized by design so that it has a channel width-to-length (W/L) ratio that is 2 times the channel W/L ratio of n-channel MOSFETs M1 and M2. The W/L ratio of transistor M3 relative to the W/L ratio of transistors M1 and M2 determnines the current through transistor M3. Thus, when I/2 flows through each of transistors M1 and M2, a current equal to I flows through M3, causing $V_{OUT}$ to be accurate with a low signal-to-noise ratio.

However, a significant parasitic current $i_{EQS1}$ and $i_{EQS2}$ does flow into the emitters of parasitic transistors $Q_{S1}$ and $Q_{S2}$. The parasitic current causes the current through transistors M1 and M2 to be less than I/2. Because the current through transistor M3 is still I, $V_{DS}$ of M1 and $V_{DS}$ of M2 are no longer equal and the circuit is unbalanced, causing an offset voltage with respect to the amplifier inputs or an inaccurate $V_{OUT}$. Therefore, transistors $Q_{S1}$, and $Q_{S2}$ cause prior art amplifier 10 to have a systematic offset voltage at $V_{OUT}$.

It would therefore be desirable to provide a CMOS compatible input amplifier that improves upon prior art input amplifier 10 by reducing output offset to provide a more accurate amplified signal $V_{OUT}$.

BRIEF SUMMARY OF THE INVENTION

The present invention comprises an input amplifier circuit that provides a low input offset voltage amplified output signal. Input amplifiers of the present invention include a differential pair of transistors that may be fabricated using standard CMOS process steps. Each transistor in the differential pair includes a parasitic transistor that reduces the current through the associated differential pair transistor.

The differential pair has a single ended output coupled to the input of a second amplifier such as a MOSFET. The current through the second amplifier determines the output signal $V_{OUT}$. The second amplifier is coupled to a third transistor which also includes a parasitic transistor. The third transistor provides a bias current to the second amplifier that is proportional to the current through the differential pair transistors. By providing a proportional current to the second amplifier, input amplifiers of the present invention output an accurate, low input offset voltage amplified signal $V_{OUT}$.

DETAILED DESCRIPTION OF THE INVENTION

Figure 1:
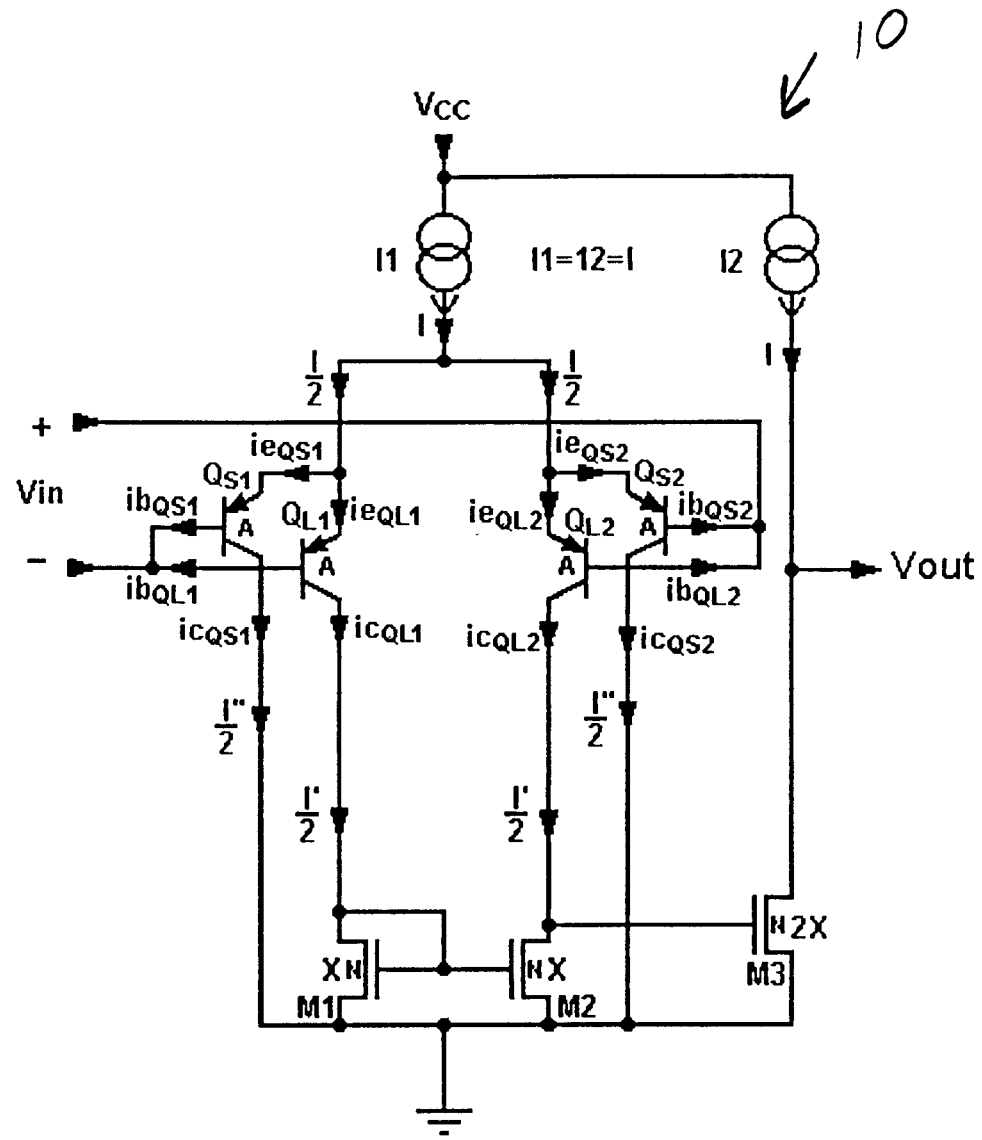
FIG. 1 is a schematic of a prior art input amplifier.
Figure 2:
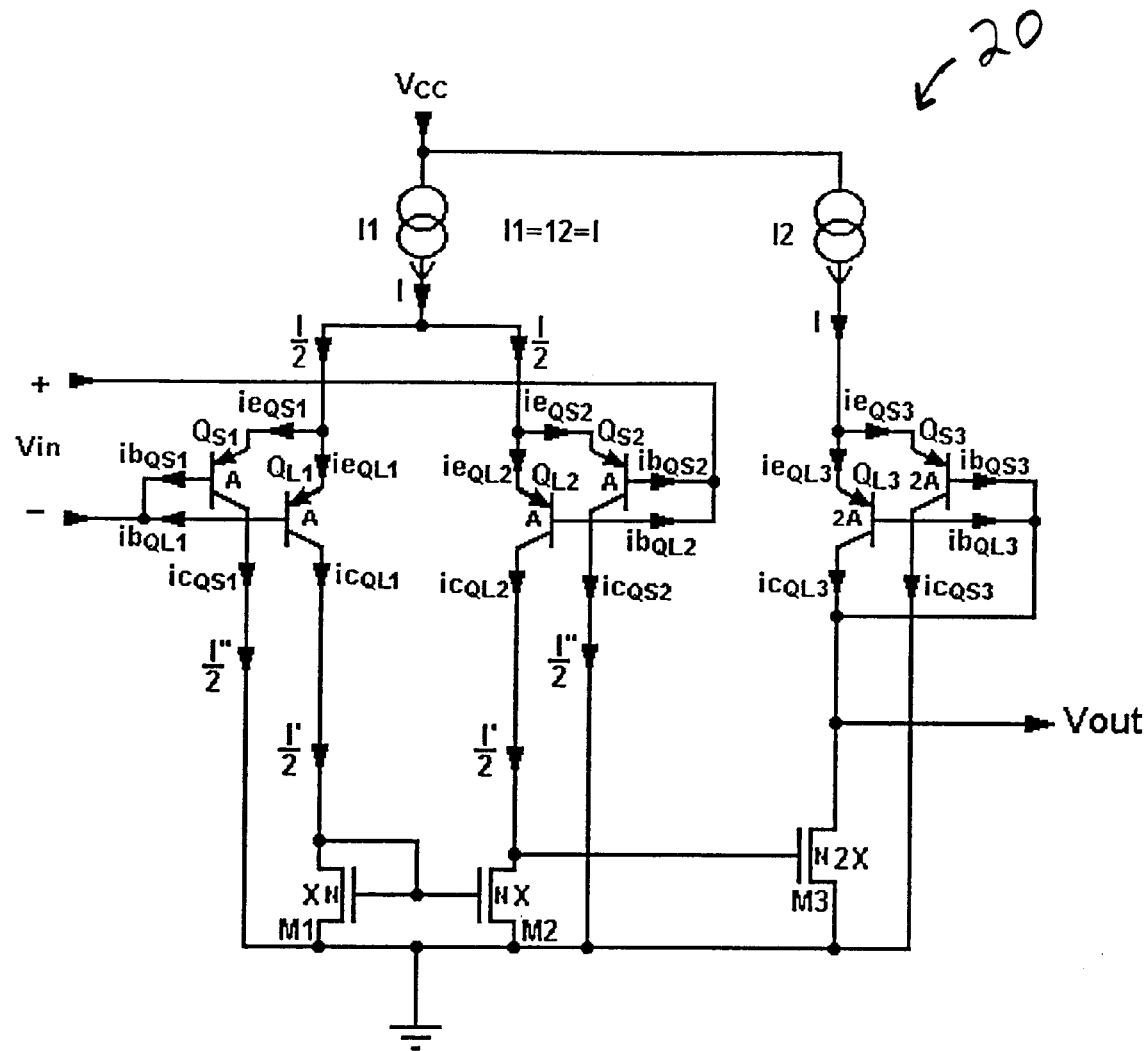
FIG. 2 is a schematic of a low input offset voltage, CMOS compatible input amplifier in accordance with the principles of the present invention.

Input amplifier 20 shown in FIG. 2 is an embodiment of the present invention. Input amplifier 20 includes differential pair lateral PNP BJTs $Q_{L1}$ and $Q_{L2}$, parasitic vertical PNP BJTs $Q_{S1}$, and $Q_{S2}$, bias current sources I1 and I2, current mirror MOSFETs M1 and M2, and output MOSFET M3, as discussed above with respect to prior art input amplifier 10.

Figure 3A:
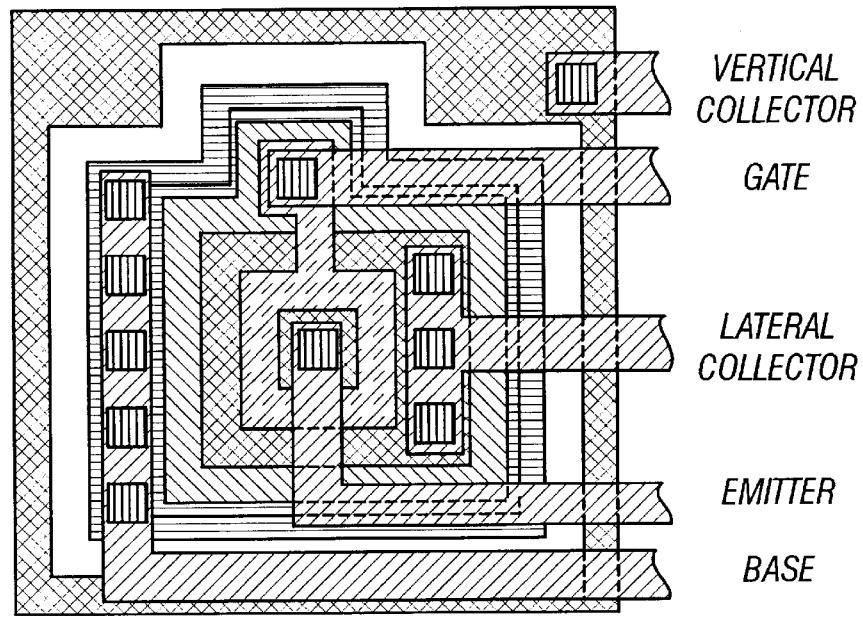
FIGS. 3A–3B illustrate top down and cross sectional views of a lateral and vertical PNP bipolar junction transistors fabricated using standard submicron CMOS process steps.
Figure 3B:
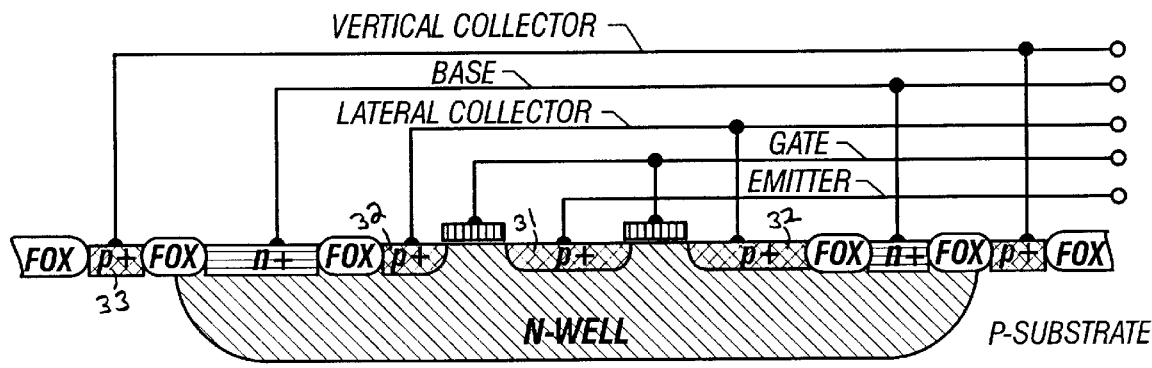
Figure 3C:
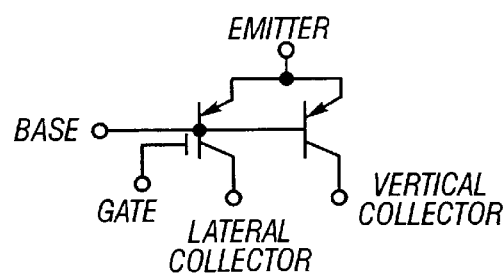
FIG. 3C illustrates a schematic of a lateral and vertical PNP bipolar junction transistors fabricated using standard submicron CMOS process steps.

Input amplifier 20 also includes lateral PNP bipolar transistor $Q_{L3}$ as shown in FIG. 2 and its associated parasitic vertical PNP bipolar transistor $Q_{S3}$. Lateral BJT $Q_{L3}$ may be formed using standard submicron CMOS process steps that are used to form p-channel MOSFETs. Top down and cross sectional layout views of an embodiment of transistors $Q_{L3}$ and $Q_{S3}$ are shown in FIGS. 3A–3B. Transistors $Q_{L3}$ and $Q_{S3}$ share the same base and emitter semiconductor regions, but have different collector semiconductor regions. The collector of vertical PNP BJT $Q_{S3}$ is tied to the P-substrate, which is grounded. The collector of lateral PNP BJT $Q_{L3}$ is coupled to the drain of MOSFET M3 and $V_{OUT}$. The gate terminals of vertical PNP BJTs $Q_{S1}$, $Q_{S2}$, and $Q_{S3}$ are biased so that the parallel PMOS devices are kept off.

The forward current gain β of a bipolar junction transistor equals the collector current divided by the base current ($\beta=I_C/I_B$). The forward current gain $\beta$ varies slightly with the collector-emitter voltage $V_{CE}$ across the BJT in forward active mode. The collector-emitter voltages across transistors $Q_{S1}$ and $Q_{S2}$ are the same, and therefore, the current gain $\beta$ of transistors $Q_{S1}$ and $Q_{S2}$ are the same. The collector-emitter voltages across transistors $Q_{L1}$ and $Q_{L2}$ are substantially the same, and therefore, the current gain $\beta$ of transistors $Q_{L1}$ and $Q_{L2}$ are substantially the same.

It can be assumed that $V_{CE}$ of transistor $Q_{L3}$ is substantially the same as $V_{CE}$ of transistor $Q_{L2}$, and that $V_{CE}$ of transistor $Q_{S3}$ is substantially the same as $V_{CE}$ of transistor $Q_{S2}$, as can be seen in FIG. 2. Therefore, the ratio of the current gain of transistor $Q_{L3}$ to the current gain of transistor $Q_{S3}$ is the substantially equal to the current gain ratio of transistor $Q_{L2}$ to transistor $Q_{S2}$, as shown in the following equation:

$$\frac{\beta_{QL3}}{\beta_{QS3}} \approx \frac{\beta_{QL2}}{\beta_{QS2}} \quad (1)$$

Any differences in $V_{CE}$ between $Q_{S3}$ and $Q_{S2}$ as well as differences in $V_{CE}$ between $Q_{L3}$ and $Q_{L2}$ are generally small enough so as not to introduce a significant error term into the circuit performance such that equation (1) generally applies. A cascode circuit may be coupled in series between $Q_{L2}$ and M2 to independently adjust the collector voltage of $Q_{L2}$ so that the $\beta$ ratios shown in equation (1) are as close as possible.

In circuit 20, both current sources I1 and I2 provide a bias current equal to I. A first portion of current I from current source I2 flows through transistor $Q_{L3}$ and a second portion of current I from current source I2 flows through transistor $Q_{S3}$. Transistors $Q_{L3}$ and $Q_{S3}$ have base-emitter junction areas that are two times the base-emitter junction areas of transistors $Q_{L1}/Q_{S1}$ and transistors $Q_{L2}/Q_{S2}$ in the embodiment of FIG. 2. Transistors $Q_{L3}$ and $Q_{S3}$ have the same current density as transistors $Q_{L2}$ and $Q_{S2}$, respectively, as long as their current gains 13 satisfy equation (1).

As long as equation (1) remains valid, the current through transistor $Q_{L3}$ is substantially equal to two times the current through transistor $Q_{L1}$ and two times the current through transistor $Q_{L2}$, because a proportional amount current I is diverted through parasitic vertical transistors $Q_{S1}/Q_{S2}/Q_{S3}$. Therefore, even when the current $i_{EQL1}$ and $i_{EQL2}$ through transistors $Q_{L1}$ and $Q_{L2}$ varies from I/2, the current $i_{EQL3}$ through transistor $Q_{L3}$ is proportionally larger than $i_{EQL1}$ and $i_{EQL2}$, according to the base-emitter junction ratios of transistors $Q_{L1}/Q_{L2}/Q_{L3}$.

The base currents $i_{bQS3}$ and $i_{bQL3}$ flow out of the bases of transistors $Q_{S3}$ and $Q_{L3}$ and into the drain of transistor M3. Base currents $i_{bQS3}$ and $i_{bQL3}$ introduce an error term that causes some distortion in output signal $V_{OUT}$. However, the distortion in $V_{OUT}$ introduced by these base currents is small if the current gain $\beta$ of transistors $Q_{L3}$ and $Q_{S3}$ is relatively high during forward active mode (e.g., 100). The lateral PNP BJT shown in FIGS. 3A–3B, for example, typically has a current gain in the range of 100–200. The vertical PNP BJT shown in FIGS. 3A–3B, for example, typically has a current gain of 500.

Input amplifier circuit 20 provides an amplified output signal $V_{OUT}$ at the drain of M3 that has a low input offset voltage, a higher signal-to-noise ratio, and that is more accurate and more predictable than the output signal of prior art amplifier circuit 10. Input amplifier 20 also has a more predictable gain, which makes it easier to compensate.

In further embodiments of the present invention, the currents of current sources I1 and I2 may have any suitable ratio besides one-to-one. For example, current source I2 may output a current that is 100 times the current of current source I1. In this embodiment, M3 has a channel W/L ratio that is $_{200}$ times the W/L ratio of M1 and M2. Also, $Q_{L3}$ has a base-emitter junction area that is 200 times the base-emitter junction area of transistors $Q_{L1}$ and $Q_{L2}$.

In another embodiment of the present invention, PNP BJTs $Q_{L1}$, $Q_{L2}$, and $Q_{L3}$ may be replaced with NPN bipolar junction transistors. In this embodiment, each of the three NPN BJTs have a parasitic NPN bipolar junction transistor that shares the same base and emitter semiconductor regions, but have different collector regions. The emitters of the NPN BJTs in the differential pair are coupled to current source I1, and the emitter of the third NPN BJT is coupled between M3 and current source I2.

Input amplifiers may also have a differential pair amplifier with two n-channel or two p-channel field effect transistors (FETs) (e.g., MOSFETs fabricated using Gallium Arsenide technology) instead of two bipolar junction transistors. Thus, in a further embodiment of the present invention, BJTs $Q_{L1}$ and $Q_{L2}$ may be replaced with two n-channel or two p-channel FETs. In a differential pair with two p-channel FETs, each p-channel FET in the differential pair would include a parasitic p-channel FET that shares its gate and source regions, but has a different drain region. The sources of a differential pair of p-channel FETs are coupled to I1.

In a differential pair with two n-channel FETs, each n-channel FET in the differential pair would include a parasitic n-channel FET that shares its gate and source regions, but has a different drain region. The sources of a differential pair of n-channel FETs are coupled to I1.

The parasitic FETs draw current away from current mirror M1/M2. To mitigate this problem, an additional FET can be coupled between current source I2 and M3. The source of an additional n-channel FET is coupled to I2, and the source of an additional p-channel FET is coupled to 12. The additional FET also has a parasitic FET which draws current away from M3 in the same proportion that the parasitic FETs in the differential pair draw current away from M1 and M2. The additional FET has a channel W/L ratio that is sized with respect to the W/L of the FETs in the differential pair according to the current ratio current sources I1 and I2 and the sizing of transistor M3 relative to transistors M1 and M2, as with the embodiment of FIG. 2.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth. Therefore, many modifications may be made to adapt a particular situation or material to the teachings of the invention without departing from the essential scope and spirit of the present invention. It is intended that the invention not be limited to the particular embodiments disclosed, but that the invention will include all embodiments and equivalents falling within the scope of the claims.

What is claimed is:

1. An amplifier circuit comprising:
    a differential pair amplifier comprising first and second transistors, each transistor comprising first, second, and third semiconductor regions;
    a third transistor having overlapping first and second semiconductor regions with the first transistor;
    a fourth transistor having overlapping first and second semiconductor regions with the second transistor;

a second amplifier coupled to the differential pair amplifier;

a fifth transistor coupled to the second amplifier, comprising first, second, and third semiconductor regions; and a sixth transistor having overlapping first and second semiconductor regions with the fifth transistor.

2. The amplifier circuit of claim 1 wherein the first, second, third, fourth, fifth, and sixth transistors comprise field effect transistors.

3. The amplifier circuit of claim 1 wherein the first, second, third, fourth, fifth, and sixth transistors comprise bipolar junction transistors.

4. The amplifier circuit of claim 3 wherein the first, second, third, fourth, fifth, and sixth transistors comprise PNP bipolar junction transistors.

5. The amplifier circuit of claim 3 wherein the first, second, and fifth bipolar junction transistors are fabricated using CMOS process steps.

6. The amplifier circuit of claim 5 wherein the first, second, and fifth bipolar junction transistors are fabricated using submicron CMOS process steps that are used to form p-channel MOSFETs.

7. The amplifier circuit of claim 1 wherein the second amplifier comprises a MOSFET.

8. The amplifier circuit of claim 1 wherein the differential pair amplifier further comprises a current mirror circuit.

9. The amplifier circuit of claim 1 wherein the third semiconductor regions of the third, fourth, and sixth transistors are tied to a semiconductor substrate.

10. The amplifier circuit of claim 1 wherein the second semiconductor regions of the first, second, and fifth transistors comprise first, second, and third N-well regions, respectively.

11. The amplifier circuit of claim 10 wherein the first semiconductor regions of the first, second, and fifth transistors comprise first, second, and third P+ regions in first, second, and third N-well regions, respectively.

12. The amplifier circuit of claim 11 wherein the third semiconductor regions of the first, second, and fifth transistors comprise fourth, fifth, and sixth P+ semiconductor regions surrounding the first, second, and third P+ regions, respectively.

13. The amplifier circuit of claim 1 further comprising:
a first current source coupled to the first, second, third, and fourth transistors; and
a second current source coupled to fifth and sixth transistors.

14. A method for amplifying a differential input voltage signal to provide an output voltage signal, the method comprising:
providing a first bias current to a differential pair of first and second transistors, and to third and fourth parasitic transistors,
wherein the first and third transistors have the same first and second semiconductor regions, and the second and fourth transistors have the same third and fourth semiconductor regions;
amplifying the differential input voltage signal using the differential pair;
providing a second bias current to a fifth transistor and a sixth parasitic transistor, wherein the fifth and sixth transistors have the same fifth and sixth semiconductor regions; and
providing the output voltage signal using an amplifier that receives a signal from the differential pair and that receives current from the fifth transistor.

15. The method of claim 14 wherein the first, second, third, fourth, fifth and sixth transistors are field effect transistors.

16. The method of claim 15 wherein the first, second, third, fourth, fifth and sixth transistors are n-channel field effect transistors.

17. The method of claim 15 wherein the first, second, third, fourth, fifth and sixth transistors are p-channel field effect transistors.

18. The method of claim 14 wherein the first, second, third, fourth, fifth and sixth bipolar junction transistors are bipolar junction transistors.

19. The method of claim 18 wherein the first, second, third, fourth, fifth and sixth bipolar junction transistors are PNP bipolar junction transistors.

20. The method of claim 18 wherein the first, second, third, fourth, fifth and sixth bipolar junction transistors are NPN bipolar junction transistors.

21. The method of claim 14 wherein the amplifier comprises a MOSFET.

22. The method of claim 14 wherein the differential pair is coupled to a current mirror circuit.

23. The method of claim 14 wherein the first, second, and fifth transistors are fabricated using submicron CMOS process steps used to form p-channel MOSFETs.

24. An amplifier circuit comprising:
a differential pair amplifier comprising first and second bipolar junction transistors, each transistor comprising base, emitter, and collector semiconductor regions;

a third bipolar junction transistor having overlapping base and emitter semiconductor regions with the first transistor;

a fourth bipolar junction transistor having overlapping base and emitter semiconductor regions with the second transistor;

a second amplifier coupled to the differential pair amplifier;

a fifth bipolar junction transistor coupled to the second amplifier, comprising base, emitter, and collector semiconductor regions; and a sixth bipolar junction transistor having overlapping base and emitter semiconductor regions with the fifth transistor.

25. An amplifier circuit comprising:
a differential pair amplifier comprising first and second bipolar junction transistors, each transistor comprising base, emitter, and collector semiconductor regions;

a third bipolar junction transistor having overlapping base and collector semiconductor regions with the first transistor;

a fourth bipolar junction transistor having overlapping base and collector semiconductor regions with the second transistor;

a second amplifier coupled to the differential pair amplifier;

a fifth bipolar junction transistor coupled to the second amplifier, comprising base, emitter, and collector semiconductor regions; and a sixth bipolar junction transistor having overlapping base and collector semiconductor regions with the fifth transistor.

* * * * *